United States Patent [19]

Krieg et al.

[11] Patent Number: 5,726,569

[45] Date of Patent: Mar. 10, 1998

[54] METHOD AND APPARATUS FOR ACQUIRING IMAGE DATA IN A NUCLEAR MAGNETIC RESONANCE TOMOGRAPHY SYSTEM

[75] Inventors: Robert Krieg, Nuremberg; Harald Werthner, Fuerth, both of Germany

[73] Assignee: Siemens Aktiengesellschaft, Munich, Germany

[21] Appl. No.: 622,689

[22] Filed: Mar. 26, 1996

[30] Foreign Application Priority Data

Mar. 30, 1995 [DE] Germany ................. 195 11 794.8

[51] Int. Cl.$^6$ ................................................ G01V 3/14
[52] U.S. Cl. ................................. 324/309; 324/307
[58] Field of Search ............................... 324/300, 307, 324/309, 318; 128/653.2, 653.3, 653.4

[56] References Cited

U.S. PATENT DOCUMENTS

| | | | |
|---|---|---|---|
| 4,707,658 | 11/1987 | Fraham et al. | |
| 4,769,603 | 9/1988 | Oppelt et al. | |
| 4,891,595 | 1/1990 | Granot | 324/309 |
| 5,070,299 | 12/1991 | Kiefer et al. | 324/309 |
| 5,432,448 | 7/1995 | Heid et al. | 324/309 |

FOREIGN PATENT DOCUMENTS

| | | |
|---|---|---|
| 0 204 569 | 6/1991 | European Pat. Off. |
| 0 567 194 | 10/1993 | European Pat. Off. |
| 0 394 504 | 4/1994 | European Pat. Off. |

OTHER PUBLICATIONS

"Bildgebende Systems für die medizinische Diagnostik," Krestel, Ed., pp. 544–545 (1988).
"Missing Pulse Steady–State Free Precession," Patz et al., Magnetic Resonance in Medicine, vol. 10 (1989), pp. 194–209.
"Effects of Diffusion in Nuclear Magnetic Resonance Spin–Echo Experiments," Woessner, Journal of Chemical Physics, vol. 34, No. 6 (Jun. 1961), pp. 2057–2061.
"Suppression of Artefacts Due to Imperfect π–Pulses in Multiple Echo Fourier Imaging," Duijn et al., SMRM 1984 (pp. 197–198).

*Primary Examiner*—Sandra L. O'Shea
*Assistant Examiner*—Michael B. Eisenberg
*Attorney, Agent, or Firm*—Hill, Steadman & Simpson

[57] ABSTRACT

In a magnetic resonance imaging apparatus and method the following pulse sequence is repeated N times for acquiring image data. A first radio-frequency pulse is emitted for exciting nuclear spins, in an examination subject. A second radio-frequency pulse is emitted after a time span for rephasing the nuclear spins. Readout of the resulting nuclear magnetic resonance signal under a frequency-coding gradient takes place after a further time span following the second radio-frequency pulse. After waiting another time span, the first radio-frequency pulse of the next sequence is emitted. The pulse sequence is configured such that the nuclear magnetic resonance signals arising from the second radio-frequency pulse of the $n-1^{th}$ sequence and the first radio-frequency pulse of the following $n^{th}$ pulse sequence do not superimpose.

18 Claims, 9 Drawing Sheets

METHOD AND APPARATUS FOR ACQUIRING IMAGE DATA IN A NUCLEAR MAGNETIC RESONANCE TOMOGRAPHY SYSTEM

BACKGROUND OF THE INVENTION

1. Field of the Invention

The present invention is directed to a nuclear magnetic resonance tomography apparatus and to a method, in the form of a pulse sequence, for operating a nuclear magnetic resonance tomography apparatus, for acquiring image data.

2. Description of the Prior Art

A method for acquiring image data in a nuclear magnetic tomography apparatus, is disclosed, for example, in European Application 0 394 504 as well as in the article by S.Patz, et al., "Missing Pulse Steady-State Free Precession" in Magnetic Resonance in Medicine 10, 194 through 209 (1989), repeats the following sequence N times. A first radio-frequency pulse is emitted for exciting nuclear spins in an examination subject. A second radio-frequency pulse is emitted after a time span for rephasing the nuclear spins. A nuclear magnetic resonance signal is read out under a frequency-coding gradient after a time span following the second radio-frequency pulse. After waiting a further time span, the first radio-frequency pulse of the next sequence, is emitted. The repetition time between the first radio-frequency pulse of every $n^{th}$ sequence and the first radio-frequency pulse of the immediately following $n+1^{th}$ sequence is shorter than the longitudinal and transverse relaxation time of the examination subject.

In this known sequence, the nuclear magnetic resonance signal evaluated for the measurement arises as a spin echo signal, i.e. the previously dephased spins are in turn rephased by a radio-frequency pulse and thus supply a signal. Compared to the gradient echo technique that is in widespread use for fast imaging sequences, this type of signal acquisition has the advantage that it is less sensitive to magnetic field inhomogeneities.

In this known pulse sequence, the respective time intervals between the first and the second radio-frequency pulses, between the second radio-frequency pulse and the readout phase, as well as between the readout phase and the first radio-frequency of the next sequence, are all equal. Thus not only nuclear magnetic resonance signals due to the excitation and refocussing in the respective sequence (referred to as primary echoes), but also nuclear magnetic resonance signals from the excitation or refocussing of preceding sequences, arise at the readout time. Each measured signal thus represents the superimposition of a number of nuclear magnetic resonance signals. Interferences that lead to so-called "banding" artifacts can thereby arise.

The above-described sequence is executed very rapidly due to the repetition of the sequence after a time that is shorter than the longitudinal and transverse relaxation time. A steady state condition with respect to the magnetization arises after a number of excitations. This effect is also applied in the FLASH sequence (disclosed, for example, European Application 0 191 431) and in the FISP sequence (disclosed, for example, in U.S. Pat. No. 4,769,603). A gradient echo is interpreted as the measured signal in both sequences. Gradient echo sequences, however, are subject to susceptibility effects or time-dependent effects such as, for example, eddy currents. These effects lead to artifacts such as, for example, geometrical and intensity distortions or, in the worst case, can cause a signal loss.

The FLASH and FISP sequences differ in that no rephasing of the previously-set gradient encoding ensues in the FLASH method before the next excitation. An incoherent steady state condition therefore arises. In the FISP method, at least the phase-coding gradient is in turn reset after the readout of a nuclear magnetic resonance signal and before the beginning of the next excitation. A coherent steady state condition thus arises. In the FLASH method, the incoherence can be forced, for example, by phase rotation of the excitation pulses or with strong gradients respectively having a statistically fluctuating amplitude from repetition-to-repetition.

European Application 0 204 569 discloses a pulse sequence wherein a sequence of spin echo signals is generated by multiple refocussing with 180° pulses after a 90° excitation pulse. In order to separate artifacts that stem from incomplete 180° pulses, the time interval between the first and the second 180° pulse is not immediately selected twice as long as the time interval between the 90° excitation pulse and the first 180° pulse (i.e., these time intervals are not harmonically related).

The article "Suppression of Artefacts due to Imperfect Pulses in Multiple Echo Fourier Imaging" by I.H. Duijn in SMRM Abstracts 1984 proposes that artifacts in a sequence with a plurality of successive refocussings by 180° pulses be suppressed by activating the slice selection gradients so as to differ in duration.

SUMMARY OF THE INVENTION

An object of the present invention is to provide a magnetic resonance imaging apparatus as well as a method, in the form of a pulse sequence, for operating such a magnetic resonance imaging apparatus which produce good quality images even in the case of a main magnetic field with inhomogeneities given a short measuring time. A further object of the invention is to provide such a method and apparatus wherein artifacts generated by superimposition of a number of nuclear magnetic resonance signals are avoided.

The above object is achieved in a method and apparatus in accordance with the principles of the present invention wherein the following sequence is repeated N times. A first radio-frequency pulse is emitted for exciting nuclear spins in an examination subject. A second radio-frequency pulse is emitted after a first time span following the first radio-frequency pulse, for rephasing the nuclear spins. The resulting nuclear signals are read out under a frequency-encoding gradient after a second time span following the second radio-frequency pulse. After waiting a third time span, the first radio-frequency pulse of the next repetition is emitted. The repetition time between the first radio-frequency pulse of each $n^{th}$ sequence and the first radio-frequency pulse of the immediately following $n+1^{th}$ sequence is shorter than the longitudinal and transverse relaxation times of the nuclear spins in the examination subject. The pulse sequence is configured so that the nuclear magnetic resonance signals which arise (originate) from the second radio frequency pulse of the $n-1^{th}$ repetition and the first radio-frequency pulse of the immediately following $n^{th}$ repetition do not superimpose.

DESCRIPTION OF THE PREFERRED EMBODIMENTS

Figure 1:
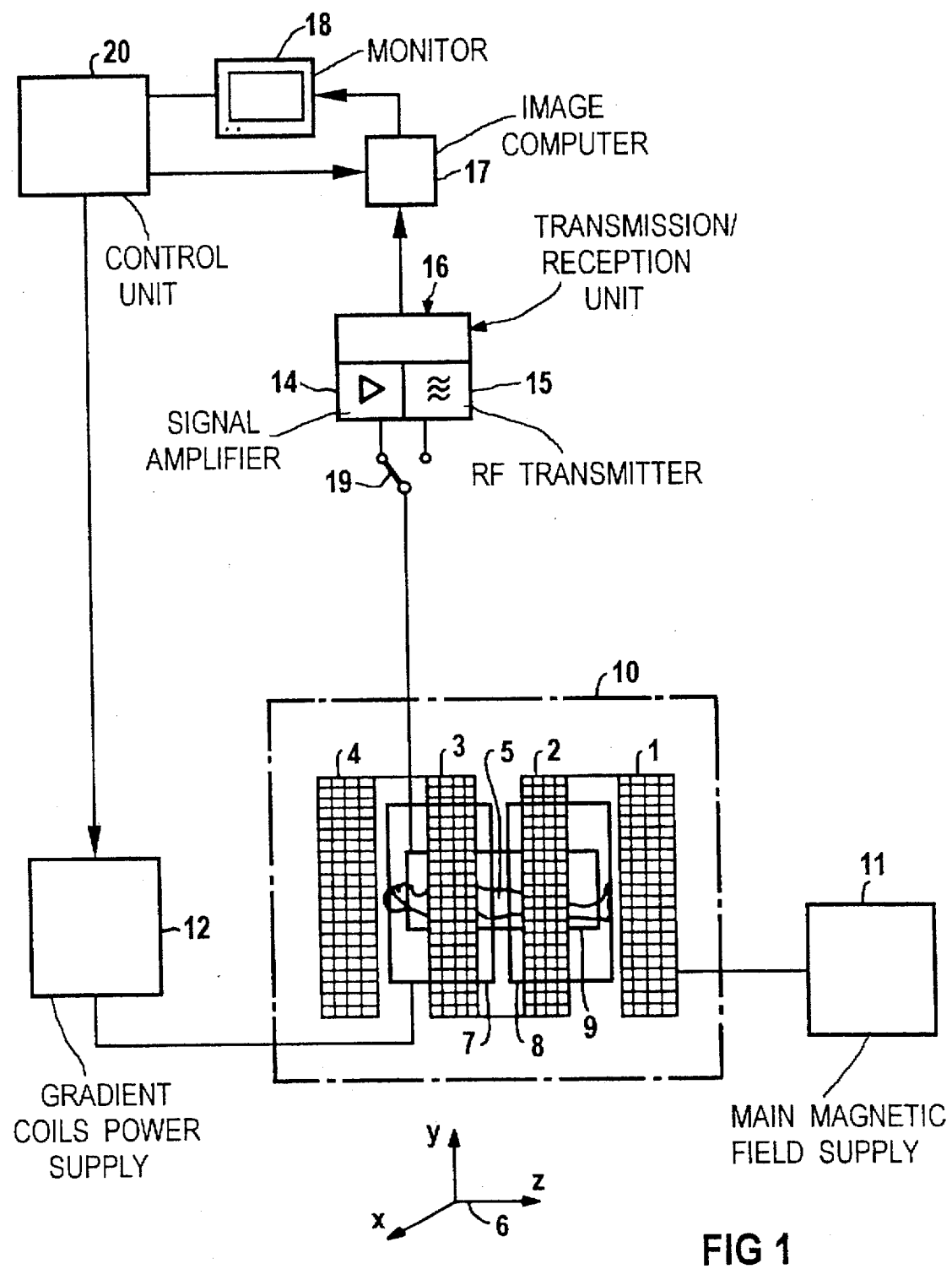
FIG. 1 is a the schematic illustration of a nuclear magnetic resonance tomography apparatus constructed and operating in accordance with the principles of the present invention.
Figure 2:
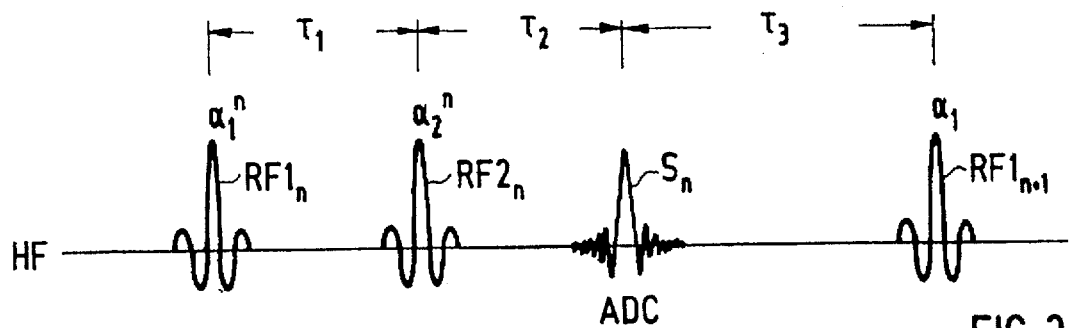
FIGS. 2–5 illustrate a pulse sequence as a first exemplary embodiment of the inventive method.
Figure 3:
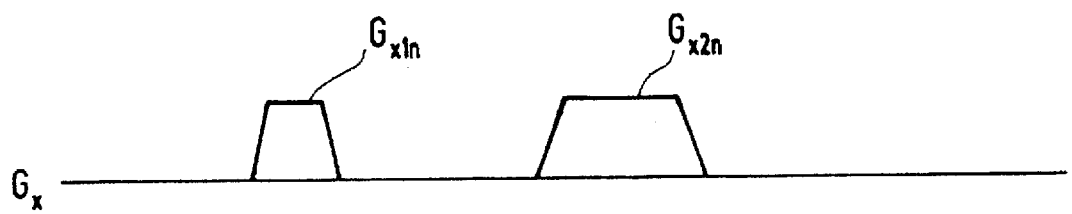
Figure 4:
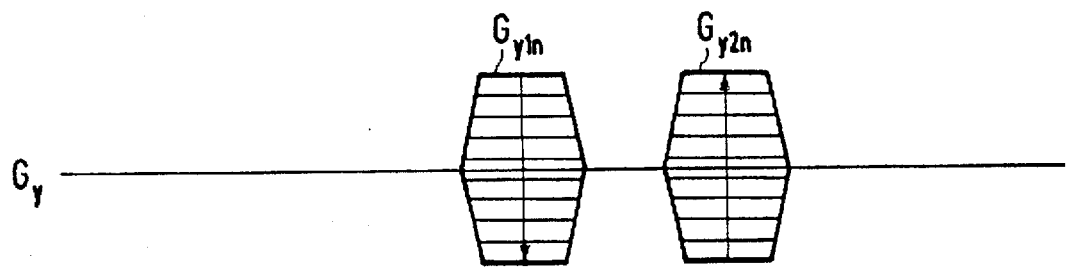
Figure 5:
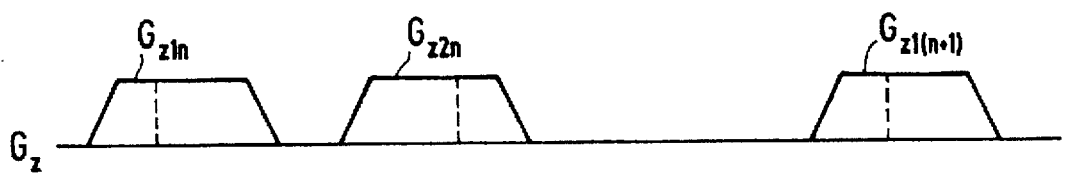

FIG. 1 schematically shows the basic components of a nuclear magnetic resonance tomography apparatus constructed and operating according to the invention. The coils 1 through 4, which are supplied by a main magnet current supply 11, generate a basic magnetic field $B_0$ wherein the body of a patient 5 under examination is located given application for medical diagnostics. Gradient coils are also present, serving the purpose of generating independent, orthogonal magnetic field components in the x, y, and z directions defined according to the Cartesian coordinate axes 6. For clarity, FIG. 1 shows only the gradient coils 7 and 8 that, together with a pair of identical gradient coils opposite thereto, generate the x-gradient. The identical y-gradient coils (not shown) lie parallel to, and above and below, the body 5. Coils for the z-gradient field respectively lie at the head and foot ends of the body 5, oriented transversely relative to the longitudinal axis thereof.

The arrangement also contains a radio-frequency antenna 9 that serves the purpose of generating and receiving the nuclear magnetic resonance signals. The gradient coils are supplied by a gradient amplifier 12. The radio-frequency antenna 9 is coupled, during a reception mode, via a signal amplifier 14 to an image computer 17 to which a monitor 18 is connected for display of the image. During a transmission mode, the radio-frequency antenna 9 is connected to a radio-frequency transmitter 15. The signal amplifier 14 and the radio-frequency transmitter 15 form a transmission/reception unit 16 for signal generation and pick-up. A switching stage 19 enables switching between the transmission and the reception mode.

The gradient amplifier 12, the transmission/reception unit 16 and the image computer 17 are operated by a control unit 20.

FIGS. 2 through 5 show a first pulse sequence as an exemplary embodiment of the inventive method. A first, frequency-selective radio-frequency pulse $RF1_n$ is emitted under the influence of a slice-selection gradient $G_{z1n}$, and a slice in the body 5 of the examination subject is thus excited. The nuclear spins are then pre-phased in the x-direction—this also being referred to as the readout direction below—with a gradient $G_{x1n}$. A second frequency-selective radio-frequency pulse $RF2_n$ then follows, this likewise being emitted under the influence of a slice-selection gradient $G_{z2n}$ and acting on the same slice as the first radio-frequency pulse $RF1_n$. The chronological spacing between the two radio-frequency pulses $RF1_1$ and $RF2_n$ amounts to $T_1$.

The first slice-selection gradient $G_{z1n}$ is activated somewhat before the first radio-frequency pulse $RF1_n$ and the second slice-selection gradient $G_{z2n}$ is deactivated somewhat after the second radio-frequency pulse $RF2_n$. This is indicated with broken lines in the slice selection gradients $G_{z1n}$ and $G_{z2n}$. This results in the dephasing of the nuclear spins caused by the respective slice selection gradients being in turn canceled; it must be taken into consideration that the part of the slice selection gradient after the radio-frequency pulse $RF2_n$ acts oppositely to the preceding slice selection gradient $G_{z1n}$, due to its inverting effect.

A first phase-encoding gradient $G_{y1n}$ is activated after the second radio-frequency pulse $RF2_n$.

Due to the inverting effect of the second radio-frequency pulse $RF2_n$, the nuclear magnetic resonance signal excited by the first radio-frequency $RF1_n$ is in turn rephased, so that a nuclear magnetic resonance signal $S_n$ in the form of a spin echo arises. This nuclear magnetic resonance signal $S_n$ is sampled under the influence of a readout gradient $G_{x2n}$, and the samples are digitized and transferred into a raw data matrix in a known way. The nuclear magnetic resonance signal is encoded in the x-direction by the readout gradient $G_{x2n}$ and in the y-direction by the phase-encoding gradient $G_{y1n}$.

The time span $T_1$ between the second radio-frequency pulse RF2 and the nuclear magnetic resonance signal S is equal to the time span $T_1$ between the first radio-frequency pulse $RF1_n$ and the second radio-frequency pulse $RF2_n$.

A phase-encoding gradient $G_{y2n}$ that has the same amplitude-time area as the phase-encoding gradient $G_{y2n}$ but an opposite sign is activated after the readout of the nuclear magnetic resonance signal $S_n$. The phase-encoding of the nuclear spins is thus reset to zero.

The first radio-frequency pulse $RF1_{n+1}$ of the next pulse sequence follows after a waiting time $T_3$ following the nuclear magnetic resonance signal S. The illustrated pulse sequence is repeated N times, with the values of the phase-encoding gradients $G_{y1}$, $G_{y2}$ being incremented step-by-step in successive repetitions, as indicated by the stepping in FIG. 4.

The first radio-frequency pulse $RF1_{n+1}$ of the following sequence is emitted before the excited nuclear spins in the body 5 have relaxed. A steady state condition of the nuclear magnetization is thus established after a few sequence repetitions. Given a standard spin echo sequence, the flip angle $\alpha 1$ of the first radio-frequency pulse RF1 would be selected equal to 90° and the flip angle $\alpha 2$ of the second radio-frequency pulse RF2 would be selected equal to 180° for achieving a maximum signal. Given fast repetition, however, a saturation of the magnetization would quickly occur using these values. For the steady-state sequence employed herein, therefore, the flip angles $\alpha 1$, $\alpha 2$ are selected significantly lower, similar to the FISP sequence mentioned at the outset. The optimum flip angle becomes smaller as the repetition time becomes shorter. For example, respective flip angles of 60° were selected for both radio-frequency pulses RF1 and RF2 for the case of the coherent steady-state condition in the exemplary embodiment. It should be noted that a radio-frequency pulse with a flip angle of 180° is not necessarily required for the inversion needed to generate a spin echo. On the contrary, each radio-frequency pulse splits the existing spin magnetization into three components with respect to the phase according to the partition model of Wössner (described in Journal of Chemical Physics, 34, 2057, 1961): the phase is inverted in one component, remains unmodified in another component, and the magnetization is, in yet another component, brought into a z-position that cannot be influenced by gradients.

The pulse sequence shown in FIGS. 2 through 5 differs from the prior art initially cited essentially in that the time span $T_3$ is not equal to the time spans $T_1$, $T_2$ (it is longer in the present case). One thus avoids the nuclear magnetic resonance signal arising as a superimposition of primary and secondary echoes. This is illustrated below with reference to FIGS. 6 and 7.

Figure 6:
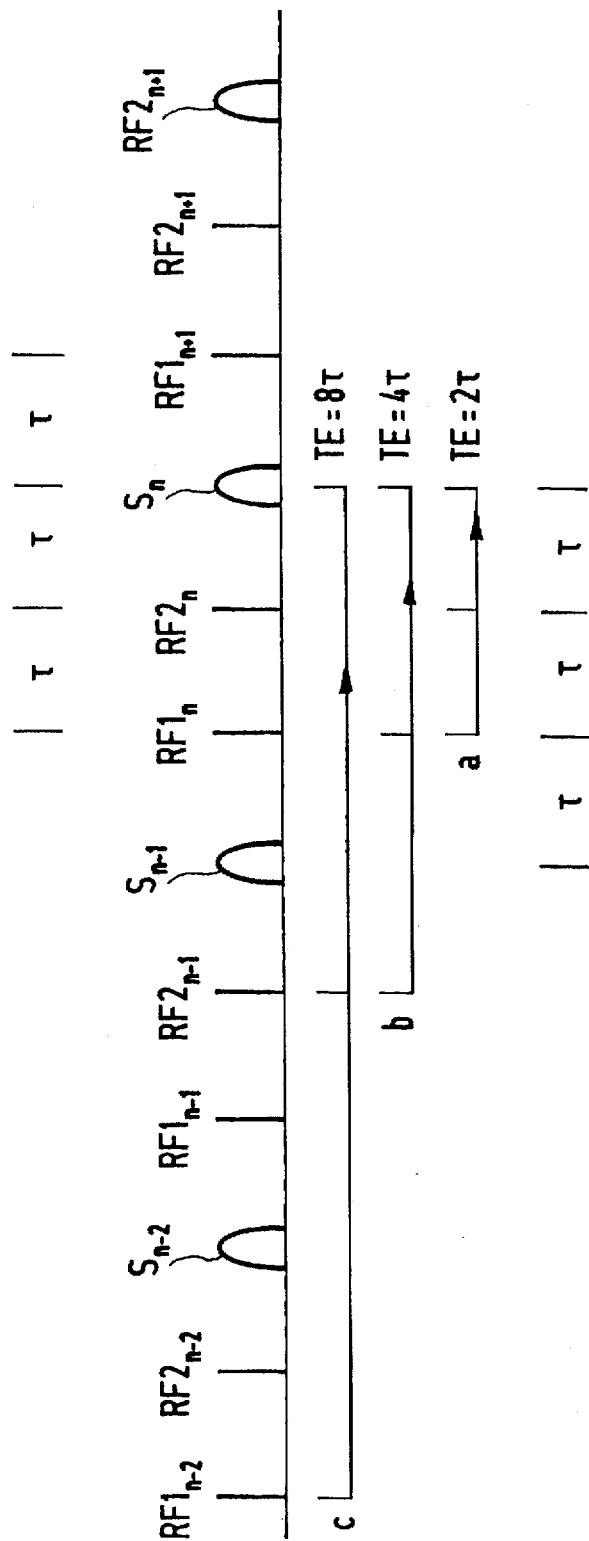
FIG. 6 is a time diagram for explaining the superimposition of nuclear magnetic resonance echo signals in known pulse sequences.

The echo generation for the initially described known pulse sequence with $T_1=T_2=T_3$ is shown in FIG. 6. This pulse sequence is also presented in the literature as so-called "missing pulse" sequence, since every third radio-frequency pulse in a sequence of radio-frequency pulses with equal spacing is missing and a signal is read out instead The excitation by the first radio-frequency pulse $RF1_n$ in combination with the refocussing by the second radio-frequency pulse $RF2_n$ supplies the main signal contribution to the nuclear magnetic resonance signal $S_n$. This signal part is referred to as the primary echo and arises—as indicated by the time axis a in FIG. 6—after an echo time 2T following the excitation by the first radio-frequency pulse $RF1_n$.

This primary echo, however, has further signal components (contributions) parts that arise from preceding sequences being superimposed on it. For example, the second radio-frequency pulse $RF2_{n-1}$ in the preceding sequence likewise generates an echo signal in conjunction with a refocussing by the first radio-frequency pulse $RF1_n$ of the allocated sequence, this being referred to as a secondary echo and coinciding with the aforementioned primary echo in the nuclear magnetic resonance signal $S_n$. As indicated by the time axis b in FIG. 6, the echo time between the excitation by the radio-frequency pulse $RF2_{n-1}$ and the nuclear magnetic resonance signal $S_n$ amounts to TE=4T. A further signal component (contribution) that arises from the excitation by the radio-frequency pulse $RF1_{n-1}$ and refocussing by the radio-frequency pulse $RF2_{n-1}$ is also shown on the time axis c in FIG. 6. The echo time TE between excitation and signal amounts to TE=8T.

In principle, all preceding sequences influence the current sequence. Due, however, to the T1 or T2 decay, the signal contribution becomes smaller as the echo time increases. It is generally adequate to consider the secondary echo signal from the preceding sequence n–1 in addition to the primary echo signal from the current sequence n.

Figure 7:
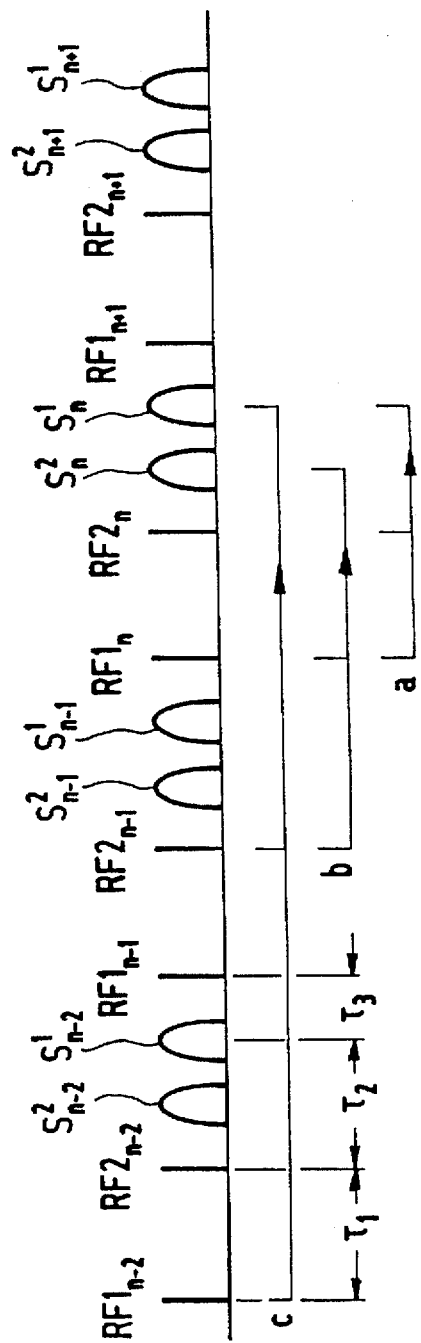
FIG. 7 is a time diagram illustrating the echo separation achieved in the inventive method and apparatus.

FIG. 7 shows that case wherein, corresponding to an exemplary embodiment of the invention, the time span $\tau_3$ is varied compared to $\tau_1$ and $\tau_2$. In the illustrated case, $\tau_3$ is shorter than $\tau_1$ and $\tau_2$. In FIG. 7, primary echoes are identified for illustration with a superscript index "1" and secondary echo signals are identified with a superscript index "2". For clarity, only the first primary echo is shown in FIG. 7 since only this is interpreted.

The creation of the first primary echo by the excitation with the radio-frequency pulse $RF1_n$ and refocussing by the radio-frequency pulse $RF2_n$ is shown on the time axis a in FIG. 7. The creation of a secondary echo due to the excitation by the radio-frequency pulse $RF2_{n-1}$ from the preceding sequence and the refocussing by the radio-frequency pulse $RF1_n$ from the current sequence, is shown on the time axis b. One can thereby see that secondary and primary echo no longer coincide here.

The creation of a further primary echo due to the excitation by the radio-frequency pulse $RF1_{n-2}$ and the refocussing by the radio-frequency pulse $RF2_{n-1}$ is shown on the time axis c. This primary echo in fact again coincides with the first primary echo Sn1 excited in the current sequence. Due to the echo time that is nearly twice as long, however, it has a significantly lower amplitude than the separated secondary echo, so that the artifact susceptibility is clearly reduced. Signal influences from sequences which occurred more distantly in the past can be left out of consideration entirely.

With the illustrated method, secondary echoes are successfully separated from primary echoes, thus noticeably reducing interferences.

A further exemplary embodiment of a pulse sequence is shown in FIGS. 8 through 11. In this embodiment, the radio-frequency pulses RF1 and RF2 are not emitted under the influence of a slice selection gradient, and thus are not slice selective. For spatial resolution in the z-direction, a phase-encoding in the z-direction, namely with the phase-encoding gradient $G_{z1}$, also ensues before the readout of the nuclear magnetic resonance signal in addition to the phase-encoding in the y-direction. Like the phase-encoding gradient $G_{y1}$, this phase-encoding gradient must be switched in a number of steps, the number of steps being dependent on the desired resolution in the z-direction. Like the phase-encoding in the y-direction, the phase-encoding in the z-direction is in turn reset after the readout of the nuclear magnetic resonance signal $S_n$, by a phase-encoding gradient $G_{z2}$ that is directed opposite to the phase-encoding gradient $G_{z1}$.

Figure 9:
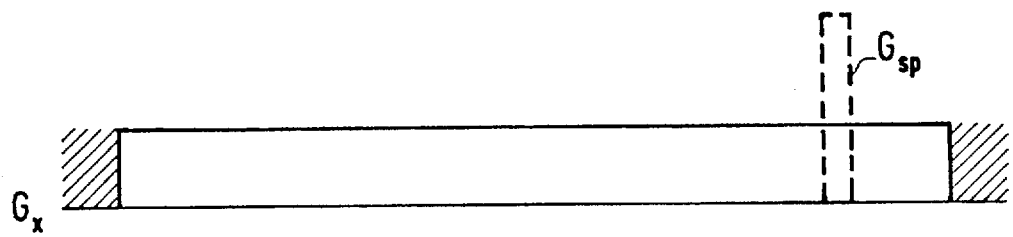
Figure 10:
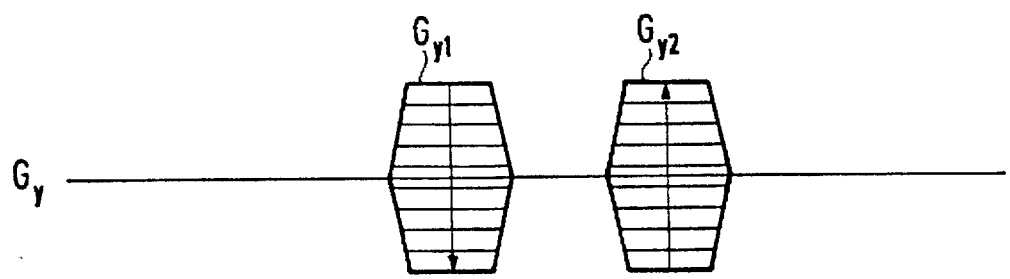
Figure 11:
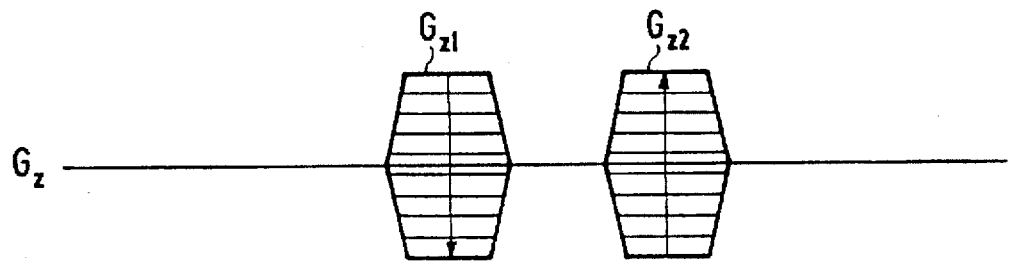
Figure 12:
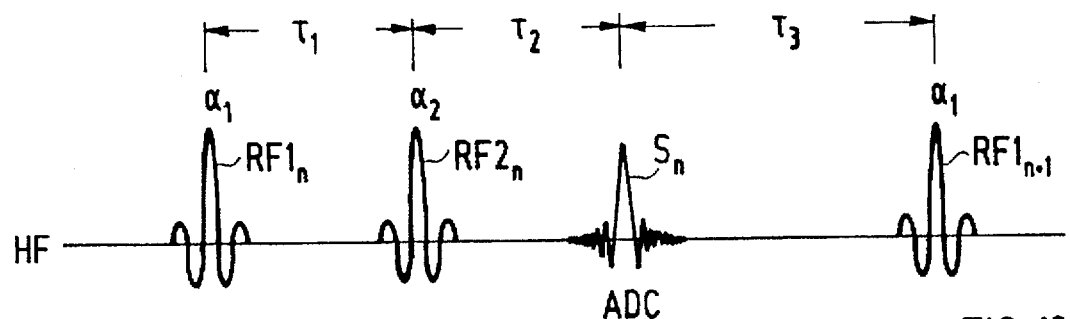
FIGS. 12–15 illustrate another embodiment of the inventive method as a pulse sequence with dephasing of undesired nuclear magnetic resonance signals with a gradient.
Figure 13:
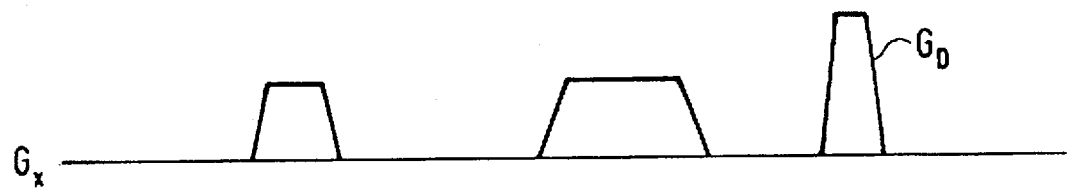
Figure 14:
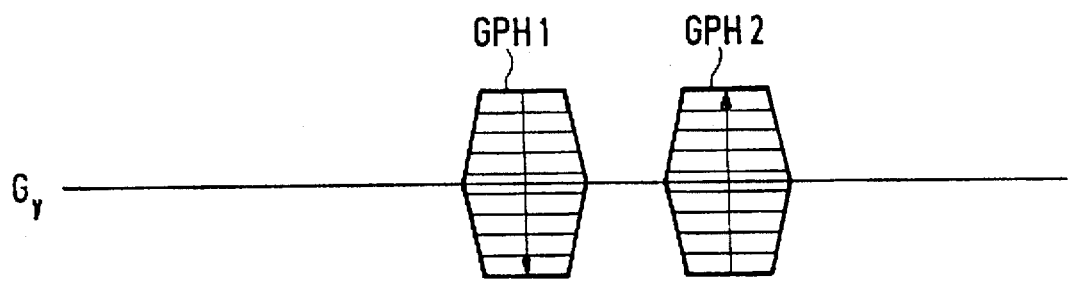
Figure 15:
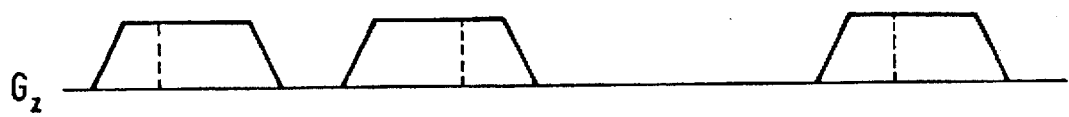

A further characteristic of this sequence is shown in FIG. 9. Here, the gradient $G_x$ in the x-direction remains constantly activated. This gradient $G_x$ could, for example, alternatively be a permanent intentional main magnetic field inhomogeneity in the x-direction (instead of a coil produced gradient) that cannot be influenced during the measurement. In order to prevent the radio-frequency pulses RF1 through RF3 from becoming slice selective in the x-direction due to the constantly acting gradient $G_x$, these must be relatively broadband.

This sequence is therefore especially suitable for imaging in non-uniform fields, such as inhomogeneity in all three spatial directions. The inhomogeneity in the x-direction that is employed as readout gradient must merely have an unambiguous (unique) spatial frequency allocation. As is known, a magnetic field inhomogeneity in the direction of the phase-encoding gradients $G_y$, $G_z$ does not lead to distortions, since only phase differences from phase-encoding step to phase-encoding step are employed, and thus the chronologically constant phase errors arising from inhomogeneities are eliminated (canceled).

Figure 8:
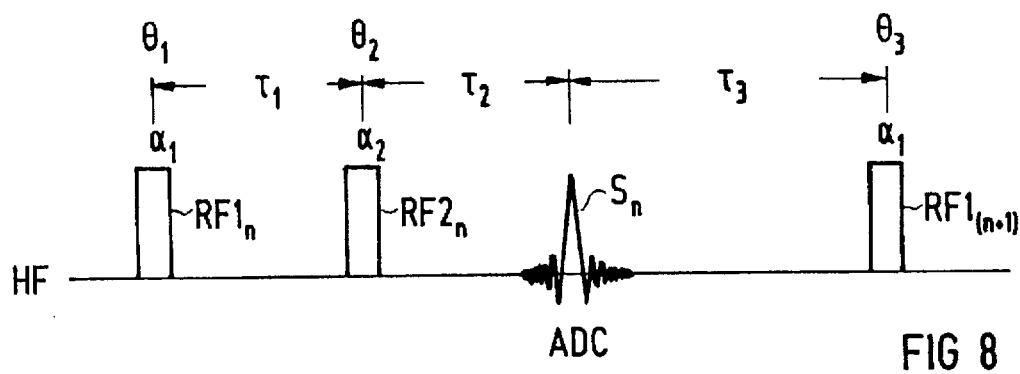
FIGS. 8–11 illustrate a further exemplary embodiment of the inventive method as a pulse sequence for acquiring three-dimensional data sets.

A further difference compared to the exemplary embodiment of FIGS. 2 through 5 is that, as shown in FIG. 8, successive radio-frequency pulses have different phase positions compared to one another, for example rotation by 51°. This is indicated in FIG. 8 by the phases "θ" shown above the radio-frequency pulses RF. This technique, which is also known in the FLASH method, is referred to as "radio-frequency spoiling". An incoherent steady-state condition is thus achieved, whereas a coherent steady-state condition is obtained in the exemplary embodiment of FIGS. 2 through 5. Coherent and incoherent steady-state conditions lead to images with different contrasts and thus with different diagnostic information or capability.

A further possibility of generating an incoherent steady-state condition is to insert a strong gradient pulse $G_{sp}$ before each sequence, as indicated with broken lines in FIG. 9. This pulse, referred to as a "gradient spoiler", has a changing amplitude from sequence-to-sequence and destroys the phase coherence from the preceding sequences. This technique is known and is referred to as gradient spoiling.

Respective flip angles of 30° have proven beneficial for the first and the second radio-frequency pulse RF1 and RF2 for the case of the incoherent steady-state condition.

FIGS. 12 through 15 show a further pulse sequence as another exemplary embodiment of the inventive method. A dephasing of secondary echoes is achieved by means of a gradient $G_D$ that destroys the coherence of the excitation that still persists, being activated after the acquisition of the nuclear magnetic resonance signal S. No signals that originate from the radio-frequency signals $RF1_n$, $RF2_n$ or from earlier radio-frequency signals can therefore arise in the following sequence. The intervals $T_1$, $T_2$, $T_3$ could thus also be made equal without causing disturbing signal superimpositions.

Otherwise, the pulse sequence of FIGS. 12 through 15 corresponds to that of FIGS. 2 through 5.

Figure 16:
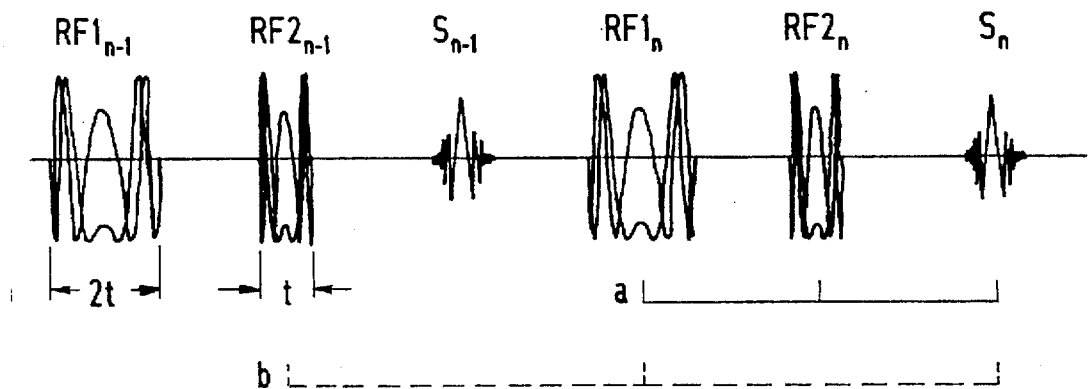
FIGS. 16 and 17 illustrate so-called "chirp" pulses which can be used as the RF pulses in the inventive method and apparatus.
Figure 17:
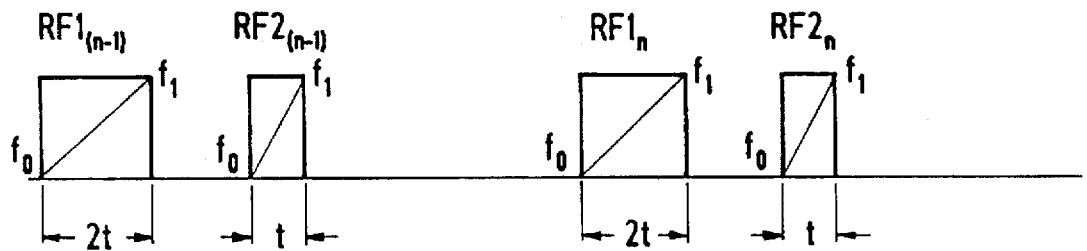

Another possibility for avoiding disturbing signal superimpositions is to employ so-called chirp pulses as the radio-frequency pulses RF1 and RF2. Such a pulse sequence is shown in FIG. 16. FIG. 17 shows that the frequency of the first radio-frequency pulses $RF1_n$ linearly rises from a first frequency $f_0$ to a frequency $f_1$ in a time span $2_t$. The rephasing condition for the signal S is met only when the frequency of the second radio-frequency pulse $RF2_n$ (refocussing pulse) likewise rises from the frequency $f_0$ to the frequency $f_1$, but in half the time, i.e. in time t. As shown on the time axis a in FIG. 16, the excitation with the radio-frequency pulse $RF1_n$ together with the radio-frequency pulse $RF2_n$ for the signal $S_n$ then meets the refocussing condition. Given conventional pulse shapes—as shown with broken lines on the time axis b in FIG. 16—, a secondary echo would arise due to the excitation with the radio-frequency pulse $RF2_{n-1}$ and a refocussing by the nuclear magnetic resonance pulse $RF1_n$. Given application of the illustrated chirp pulses, however, the refocussing condition is not met, i.e. secondary echoes do not arise.

Figure 18:
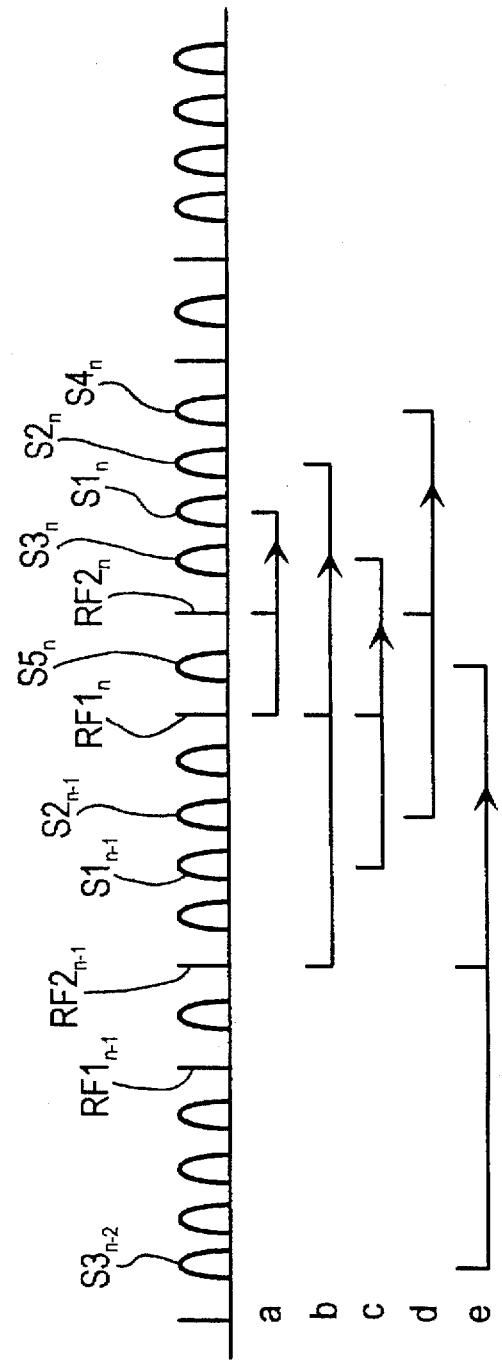
FIGS. 18–21 illustrate another embodiment of the inventive method wherein not only primary echoes but also secondary and multiply refocussed echoes as well are interpreted.
Figure 19:

In a further exemplary embodiment of the inventive method according to FIGS. 18 through 21, not only primary echoes but also secondary and multiply refocussed echoes are interpreted for image production. Time spans $T_1=T_2=\frac{2}{3}T_3$ were selected in the illustrated example. As shown in FIG. 18, five echo signals S thus arise in a repetition interval TR. The different echo paths are referenced a through e. Path a represents the creation of a primary echo $S1_n$ due to the radio-frequency pulses $RF1_n$ and $RF2_n$. Path b represents the creation of a secondary echo $S2_n$ due to the radio-frequency pulses $RF2_{n-1}$ and $RF1_n$. Path c represents the creation of a doubly refocussed echo $S3_n$, whereby the signal $S1_{n-1}$ is refocussed again by the radio-frequency pulse $RF1_n$. Path d represents the creation of a doubly refocussed signal $S4_n$, whereby the signal $S2_{n-1}$ is refocussed again by the radio-frequency pulse $RF2_n$. Path e represents the creation of a trebly refocussed signal $S5_n$, whereby the signal $S3_{n-2}$ is refocussed again by the radio-frequency pulse $RF2_{n-1}$. As shown in FIG. 19 for a repetition interval TR, a total of five chronologically separated signals $S1_n$ through $S5_n$ are obtained. These signals have respectively different amplitudes.

Figure 20:
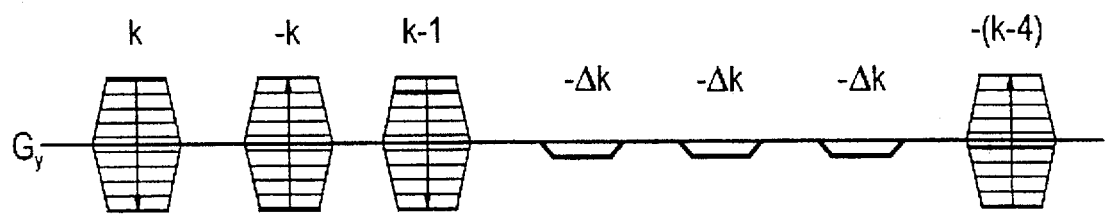
Figure 21:
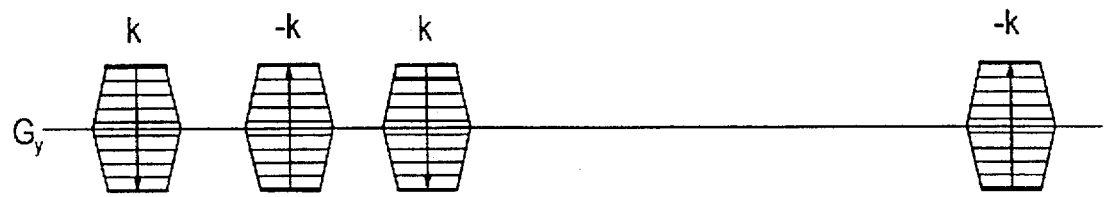

The five signals S obtained in this way can be utilized, for example, for averaging, and thus for noise enhancement. To that end, as shown in FIG. 21, they are all phase-encoded in the same way. For survey scans, however, each signal can also be provided with a different phase-coding, and measuring time can thus be saved since the k-space is filled five times faster. A corresponding phase-encoding pattern is schematically shown in FIG. 20. Of course, mixed forms are also possible, i.e. two phase-encoding steps, for example, can be implemented within a repetition phase, whereby two or three signals are averaged.

Without significant component outlay, the inventive pulse sequence and the apparatus operating according thereto enables a fast imaging that is relatively insensitive to field inhomogeneities.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring image data in a nuclear magnetic resonance tomography apparatus comprising a repetition N times of the following steps:

emitting a first radio-frequency pulse for exciting nuclear spins in an examination subject;

emitting a second radio-frequency pulse after a first time following said first radio-frequency pulse for rephasing said nuclear spins;

reading out nuclear magnetic resonance signals arising in said examination subject under a frequency-encoding gradient emitted after a second time span following said second radio-frequency pulse;

after a third time span, emitting a first radio-frequency pulse of a next repetition;

setting a repetition time between said first radio-frequency pulse of each $n^{th}$ repetition and a first radio-frequency pulse of an immediately following n+ $1^{th}$ repetition to be shorter than the longitudinal and transverse relaxation time of said nuclear spins in said examination subject; and conducting said repetitions for preventing superimposition of nuclear magnetic resonance signals originating from the second radio-frequency pulse in an $n-1^{th}$ repetition with nuclear magnetic resonance signals originating from said first radio-frequency pulse of a following $n^{th}$ repetition.

2. A method as claimed in claim 1 wherein the step of conducting said repetitions for preventing superimposition of said nuclear magnetic resonance signals comprises setting said third time span to be different from said first and second time spans.

3. A method as claimed in claim 2 comprising the step of setting said third time span longer than said first and second time spans.

4. A method as claimed in claim 1 wherein each of said first and second time spans are equal to $\frac{2}{3}$ of said third time span.

5. A method as claimed in claim 4 comprising the additional step of:

phase-encoding said nuclear magnetic resonance signals identically in each repetition and averaging the nuclear magnetic resonance signals obtained in each repetition.

6. A method as claimed in claim 4 comprising the additional step of:

differently phase-encoding said nuclear magnetic resonant signals within a repetition and thereby acquiring different k-space sections in each repetition.

7. A method as claimed in claim 1 comprising the additional step of:

generating a gradient for destroying phase coherence after readout of said nuclear magnetic resonance signals during each repetition.

8. A method as claimed in claim 7 wherein the step of generating said gradient for destroying phase coherence comprises producing a permanent inhomogeneity in a main magnetic field as said gradient for destroying phase coherence.

9. A method as claimed in claim 1 wherein the step of reading out said nuclear magnetic resonance signals under a frequency encoding gradient includes producing said frequency encoding gradient by introducing a permanent inhomogeneity in a main magnetic field.

10. A method as claimed in claim 1 further comprising generating all of said radio-frequency pulses respectively as chirp pulses, a chirp pulse comprising said first radio-frequency pulse having a frequency rising from $f_0$ to $f_1$ in a time span $t_1$ and a chirp pulse comprising said second radio-frequency pulse having a frequency rising from $f_0$ to $f_1$ in a time span which is one-half of said time span $t_1$.

11. A method as claimed in claim 1 comprising the additional step of:

in each repetition, before reading out said nuclear magnetic resonance signals, generating a phase-encoding gradient which changes from repetition-to-repetition.

12. A method as claimed in claim 11 wherein said phase-encoding gradient comprises a first phase-encoding gradient, and comprising the additional step of:

in each repetition, after reading out said nuclear magnetic resonance signals, generating a second phase-encoding gradient having a sign opposite said first phase-encoding gradient.

13. A method as claimed in claim 1 wherein all of said radio-frequency pulses are frequency-selective, and comprising the additional step of emitting each radio-frequency pulse in the presence of a slice-selection gradient.

14. A method as claimed in claim 1 comprising the additional step of:

generating two phase-encoding gradients respectively in two directions perpendicular to each other.

15. A method as claimed in claim 1 comprising the additional step of:

changing a phase position of each of said radio-frequency pulses from radio-frequency pulse-to-radio-frequency pulse.

16. A method as claimed in claim 1 comprising the additional step of:

before each radio-frequency pulse, generating a spoiler gradient having a different amplitude-time area for destroying phase coherence of said nuclear spins.

17. A nuclear magnetic resonance tomography apparatus comprising:

means for generating a basic magnetic field;

a plurality of gradient coils supplied by respective gradient amplifiers;

a radio-frequency antenna operated by a transmission/reception unit; and control means for driving said gradient amplifiers and said transmission/reception unit in a sequence for driving said transmission/reception unit for emitting a first radio-frequency pulse from said radio-frequency antenna for exciting nuclear spins in an examination subject disposed in said basic magnetic field, for driving said transmission/reception unit after a first time span following said first radio-frequency pulse for emitting a second radio-frequency pulse from said radio-frequency antenna, for driving said gradient amplifier after a second time span following said second radio-frequency pulse while receiving resulting nuclear magnetic resonance signals from said examination subject, for driving said transmission/reception unit after a third time span, which differs from said first and second time spans, for emitting a first radio-frequency pulse from said radio-frequency antenna in a next sequence, and for repeating said sequence N times with a repetition time shorter than the longitudinal and transverse relaxation time of said nuclear spins.

18. A nuclear magnetic resonance tomography apparatus comprising:

means for generating a basic magnetic field;

a plurality of gradient coils supplied by respective gradient amplifiers;

a radio-frequency antenna operated by a transmission/reception unit; and control means for driving said gradient amplifiers and said transmission/reception unit in a sequence for driving said transmission/reception unit for emitting a first radio-frequency pulse from said radio-frequency antenna for exciting nuclear spins in an examination subject disposed in said basic magnetic field, for driving said transmission/reception unit after a first time span following said first radio-frequency pulse for emitting a second radio-frequency pulse from said radio-frequency antenna, for driving said gradient amplifier after a second time span following said second radio-frequency pulse while receiving resulting nuclear magnetic resonance signals from said examination subject, driving said gradient amplifier for emitting a gradient for destroying phase coherence of said nuclear spins, for driving said transmission/reception unit, after a third time span, which differs from said first and second time spans, following reception of said nuclear magnetic resonance signals and after generating said gradient for destroying phase coherence of said nuclear spins, for emitting a first radio-frequency pulse of a next sequence, and for repeating said sequence N times with a repetition time shorter than the longitudinal and transverse relaxation time of said nuclear spins.

* * * * *